(12) United States Patent
Lee et al.

(10) Patent No.: US 6,624,404 B2
(45) Date of Patent: Sep. 23, 2003

(54) CMOS IMAGE SENSOR HAVING ENHANCED PHOTOSENSITIVITY AND METHOD FOR FABRICATING THE SAME

(75) Inventors: Ju-Il Lee, Ichon-shi (KR); Nan-Yi Lee, Ichon-Shi (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/995,215

(22) Filed: Nov. 26, 2001

(65) Prior Publication Data

US 2002/0033492 A1 Mar. 21, 2002

Related U.S. Application Data

(62) Division of application No. 09/476,423, filed on Dec. 30, 1999.

(30) Foreign Application Priority Data

Dec. 30, 1998 (KR) ........................................ 1998-61086

(51) Int. Cl.[7] .......................... H01L 27/00; H01L 31/00; H01L 21/00
(52) U.S. Cl. ............... 250/208.1; 250/214.1; 438/70
(58) Field of Search ........................ 250/208.1, 214.1; 438/70, 68

(56) References Cited

U.S. PATENT DOCUMENTS

| | | | | |
|---|---|---|---|---|
| 5,514,888 A | * | 5/1996 | Sano et al. ................... | 257/232 |
| 5,593,913 A | * | 1/1997 | Aoki | |
| 5,672,519 A | * | 9/1997 | Song et al. | |
| 6,066,511 A | * | 5/2000 | Fukusyo ....................... | 438/60 |
| 6,087,648 A | * | 7/2000 | Zhang et al. | |
| 6,221,687 B1 | * | 4/2001 | Abramovick ................ | 438/70 |
| 6,251,700 B1 | * | 6/2001 | Lin et al. | |

* cited by examiner

Primary Examiner—David Porta
Assistant Examiner—David C Meyer
(74) Attorney, Agent, or Firm—Blakely, Sokoloff, Taylor & Zafman

(57) ABSTRACT

There is provided a method for fabricating a CMOS image sensor having enhanced reliability and light sensitivity, which comprises the steps of providing a substrate including photosensitive elements and metal wire; forming a first protecting film for protecting the elements over the substrate, covering the metal wire; forming a flattened spin-on-glass film on the first protecting film; forming a second protecting film for protecting the elements on the spin-on-glass film; forming color filter patterns on the second protecting film; forming a photoresist film for flattening on the color filter patterns and the second protecting film; and forming microlenses on the photoresist film. By using the flattened SOG film and a photoresist for flattening and pad opening, the present invention can accomplish the thickness uniformity of the color filter corresponding to each unit pixel, the wire-bonding pad devoid of the residuals of the color filter materials and the figure uniformity of the microlenses. The total thickness of the films between the microlens and the photosensitive element of unit pixel can also be adjusted to focus the incident lights onto the photosensitive element of unit pixel.

8 Claims, 4 Drawing Sheets

CMOS IMAGE SENSOR HAVING ENHANCED PHOTOSENSITIVITY AND METHOD FOR FABRICATING THE SAME

This is a divisional application of Ser. No. 09/476,423 filed Dec. 30, 1999.

FIELD OF THE INVENTION

The present invention relates to a CMOS (complementary metal oxide semiconductor) image sensor having enhanced photosensitivity and a method for fabricating the same.

DESCRIPTION OF THE PRIOR ART

As well known, to embody color images in an image sensor, color filters are arranged over photosensitive parts, which receive lights from the external and generate and accumulate photocharges. The color filter array (CFA) comprises three colors of red, green and blue, or those of yellow, magenta and cyan.

The image sensor includes the photosensitive parts sensing the lights and accumulating photocharges and logic circuit parts transforming the photocharges into electric signals and generating data. To improve the photosensitivity of the image sensor, there have been proceeded endeavors to increase the area ratio (fill factor) of the photosensitive parts in the unit pixel. However, there are fundamentally limits in such endeavors, because the logic circuit parts can not be completely eliminated and thus, the photosensitive parts exist in a limited area. Accordingly, in order to increase the photosensitivity, light-collecting technique has been appeared. Using the technique, the pathways of the incident lights injecting to the regions other than the photosensitive parts are changed and collected in the photosensitive parts. For the light collecting, the image sensor includes microlenses on the color filters.

FIG. 1 is a cross-sectional view schematically showing a CMOS image sensor fabricated in accordance with a prior art. Referring to the drawing, which depicts particularly in detail the structure deposited over a photodiode, the fabrication method of the image sensor according to the prior art will be described. A field insulating film 102 is formed on a silicon substrate 101 electrically to insulate elements and a photodiode 103 as a light-receiving element is formed. After that, interlayer-insulating film 104 is deposited and metal wire 105 is formed. Subsequently, in order to protect the element from moisture or scratch, an oxide film and a nitride film are, in turn, deposited to form element-protecting film 106, which is then etched to form pad open parts (not shown). The metal wire 105 is partly exposed through the pad open parts and will provide electrical contact of the element with the external. For accomplishing color image of the image sensor, color filter array 107 is then formed on the element-protecting film. A dyed photoresist may be normally used as a color filter material. After the formation of color filter array, microlens 108 is formed on the color filter array. The microlens 108 is to collect the incident light injected to the regions other than the photosensitive region.

In the processes, due to the step coverage of the protecting film 106, the thickness of the color filter array is larger in the upper position of the photodiode 103 than the other positions thereby decreasing transmittance of light penetrated through the color filter array. A large number of incident lights are refracted at the inclined or curved parts of the nitride film having high index of refraction (2.05) and proceeded into the regions other than the photodiode region, thus to decrease the photosensitivity.

Further, the poor flatness of the color filter array 107 also causes the figures of the formed microlenses 108 on the color filter array to be different from each other and thus the property uniformity of the microlenses to be deteriorated. Since the formed microlens 108 also has poor figures in the edges, the incident lights are irregularly refracted at the edges to decrease the number of condensed lights.

Meanwhile, as shown in the drawing, the sum of the thickness of the interlayer-insulating film 104, the protecting film 106, and the color filter 107 is not sufficiently enough to focus the incident lights onto the photodiode 103. That is to say, because the focal length of the microlens is longer than the total thickness, the light sensitivity becomes low.

SUMMARY OF THE INVENTION

It is, therefore, an object of the present invention to provide a method for fabricating a CMOS image sensor having enhanced reliability and light sensitivity to overcome the shortcoming of the prior art.

It is another object of the present invention to provide a CMOS image sensor having enhanced reliability and light sensitivity to overcome the shortcoming of the prior art.

By the present invention, the color filter corresponding to each photodiode can be uniform in the thickness. The residuals of the color filter materials on the wire-bonding pad can also be completely removed. The figures of the microlenses can still also be uniform. The total thickness of the films between the microlens and the photodiode can still also be fitted to the focal length of the microlens or established to focus the incident lights onto the photodiode.

In accordance with an aspect of the present invention, there is provided a method for fabricating a CMOS image sensor, which comprises the steps of: providing a substrate including photosensitive elements and metal wire; forming a first protecting film for protecting the elements over the substrate, covering the metal wire; forming a flattened spin-on-glass film on the first protecting film; forming a second protecting film for protecting the elements on the spin-on-glass film; and forming color filter patterns on the second protecting film.

The method further comprises the steps of forming a photoresist film for flattening on the color filter patterns and the second protecting film and forming microlenses on the photoresist film.

In accordance with another aspect of the present invention, there is provided a CMOS image sensor comprising: a substrate including a plurality of photosensitive elements; an interlayer-insulating film over the substrate; metal wire patterns on the interlayer-insulating film; a first protecting film on the interlayer-insulating film, covering the metal wire patterns; a flattened spin-on-glass film on the first protecting film; a second protecting film on the spin-on-glass film; color filter patterns on the second protecting film; a photoresist film for flattening on the color filter patterns and the second protecting film; and microlenses on the photoresist film.

Preferably, the formed spin-on-glass (SOG) film is etched back. The photoresist film is used as a mask for pad opening. That is to say, before the step of forming the microlenses, the photoresist film is selectively exposed at pad open regions and developed to be removed at the pad open regions. The first and second protecting films are then selectively etched to form the pads of metal wire at the regions. The photoresist plays a role of etching mask during the etching processes. The first protecting film is preferably an oxide film and the second protecting film is preferably an oxynitride film.

Preferably, the thickness of the photoresist is determined to focus the incident lights onto the photosensitive element. The thickness is preferably determined based on the focal length of the microlens in the well-known medium of, particularly, vacuum or air and the indices of refraction of the films between the microlens and the photosensitive element. It is preferable to form the photoresist with transparent material. The photosensitive element is preferably a photodiode and the image sensor may include some transistors as well as the photodiode.

BRIEF DESCRIPTION OF THE DRAWINGS

The above and other objects and features of the present invention will become apparent from the following description of preferred embodiment given in conjunction with the accompanying drawings, in which.

DETAILED DESCRIPTION OF THE PREFERRED EMBODIMENTS

The invention will be illustrated in detail by the following preferred embodiment with reference to the accompanying drawings.

FIGS. 2a to 2e are cross-sectional views showing fabrication processes of an image sensor in accordance with an embodiment of the present invention.

Figure 1:
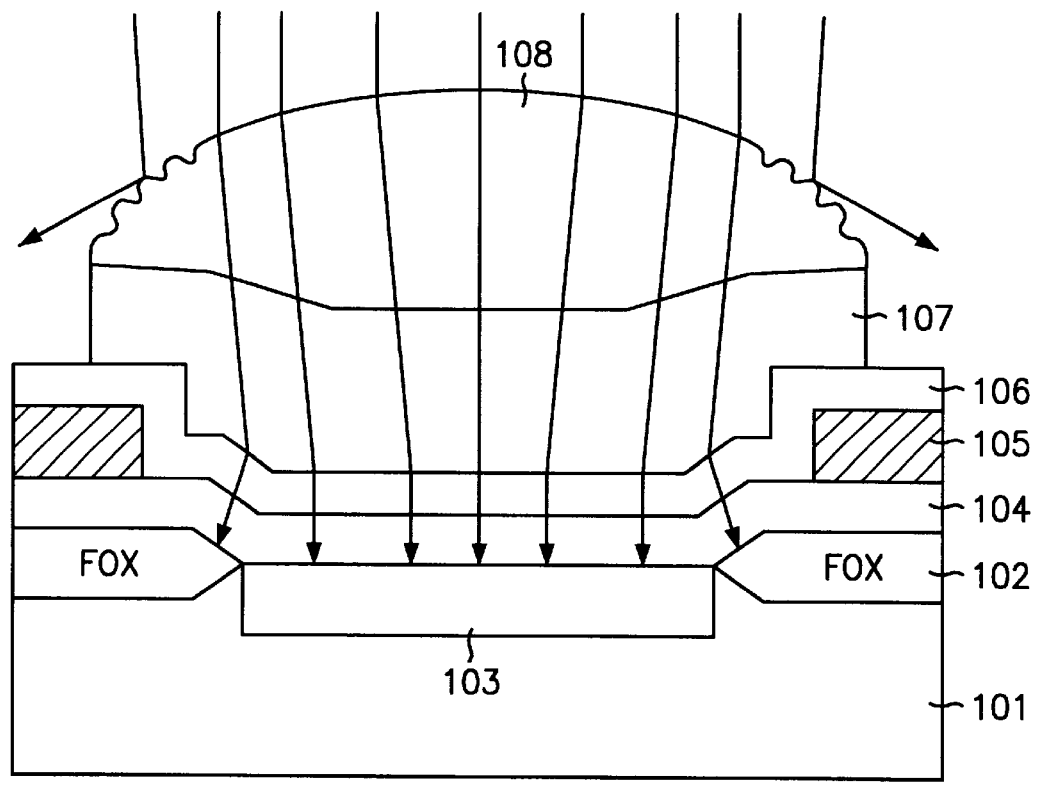
FIG. 1 is a cross-sectional view schematically showing a CMOS image sensor fabricated in accordance with a prior art.
Figure 2A:
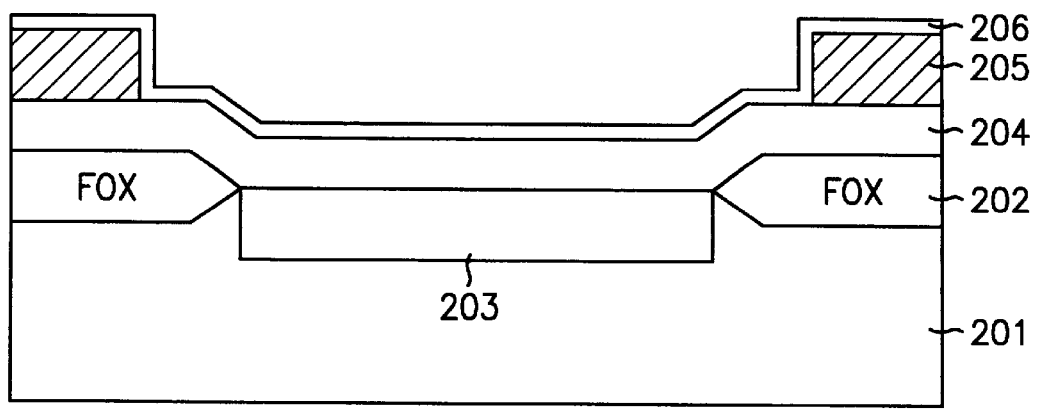
FIGS. 2a to 2f are cross-sectional views showing fabrication processes of a CMOS image sensor in accordance with an embodiment of the present invention.

First, referring to FIG. 2a, in order to insulate elements electrically, a field insulating film 202 is formed on a silicon substrate 201 and unit pixels including photosensitive element 203, photodiode are then formed. After that, an interlayer-insulating film 204 and metal wire patterns 205 are, in turn, formed thereover. In order to protect the elements from moisture or scratch, an oxide film 206 as a first protecting film for protecting the elements is then deposited.

Figure 2B:
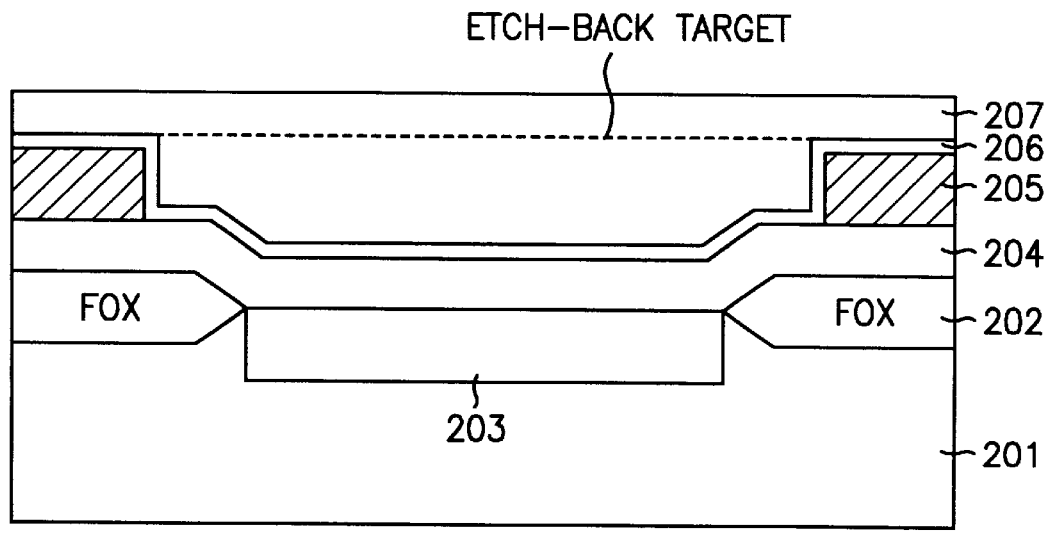

Subsequently, referring to FIG. 2b, in order to overcome the poor step coverage due to the metal wire patterns, a spin-on-glass (SOG) film 207 having excellent flatness property is deposited on the oxide film 206 and wholly etched back until the oxide film 206 is exposed, thus to obtain the flattened SOG film. At this time, since the index of refraction of the SOG film is about 1.46 same as or similar to that of the oxide film, any refraction does not occur at the boundary between those films.

Figure 2C:
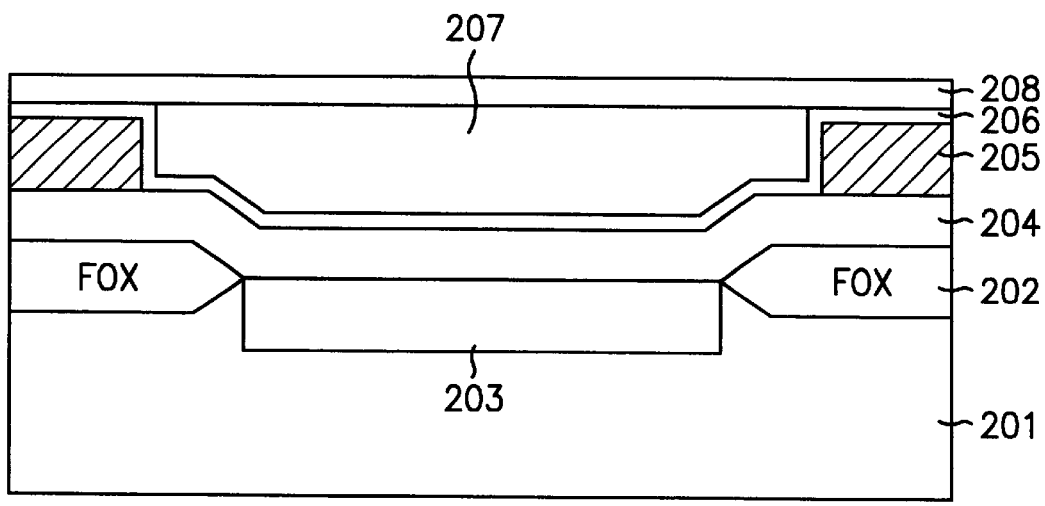

Next, referring to FIG. 2c, an oxynitride ($SiN_xO_y$) film 208 is then wholly deposited as a second protecting film with appropriate thickness. At this time, since the index of refraction of the oxynitride film 208 increases with increasing the amount of nitrogen, the ratio of oxygen and nitrogen are carefully adjusted according to the index of refraction and the protection property. In view of the index of refraction, it is more preferable that the index of refraction of the oxynitride film is more close to that of the oxide film. In that case, refraction occurs with small angle at the boundary between the first and second protecting films, and the incident lights mostly proceed to the photodiode region. Thus, the photosensitivity in case of using the oxynitride film is more enhanced than that in case of using the nitride film. Such an enhanced effect becomes greater in case of using the flattened SOG film under the second protecting film.

Figure 2D:
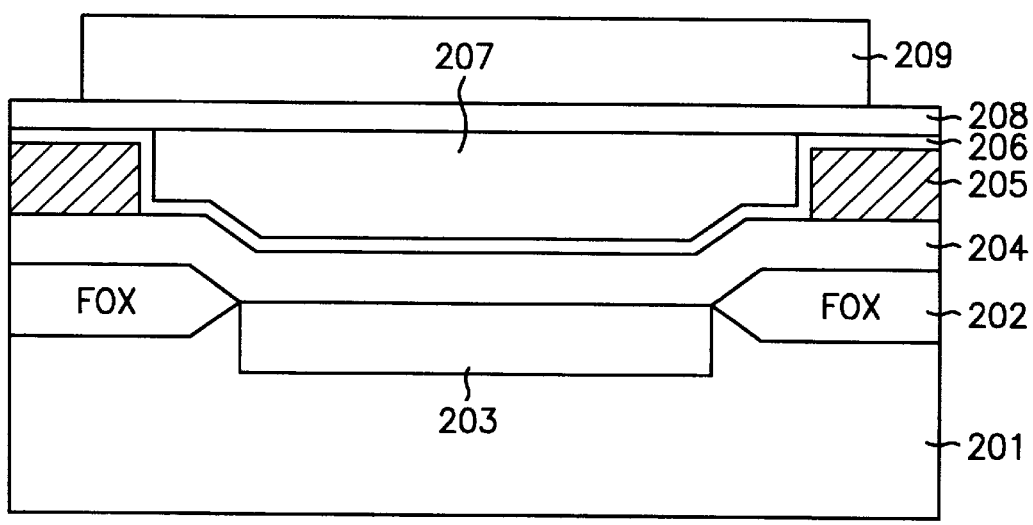
Figure 2E:
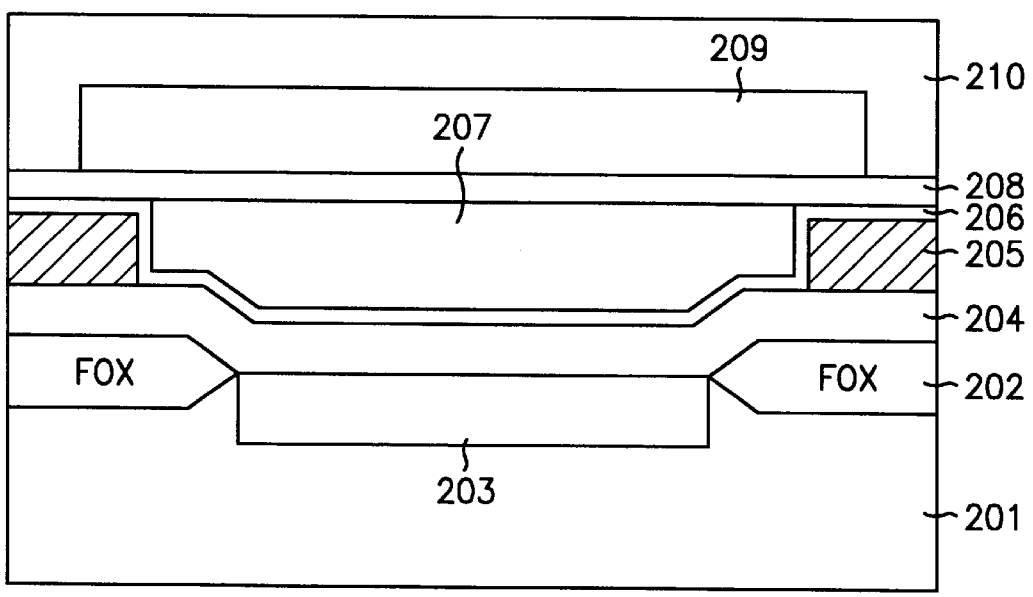

Continuously, referring to FIG. 2d, in order to embody color image from the image sensor, color filter patterns 209 are formed on the flattened protecting film, oxynitride film 208. At this time, since the oxynitride film 208 is flatted without the difference of height, the color filter corresponding to unit pixel is constant in the thickness and thus, the light transmittance penetrated through the color filter is enhanced. The height of each of the color filters corresponding to the unit pixels may be slightly different from each other in accordance with the formation method of color filter array. Subsequently, a photoresist 210 for pad opening and flattening is deposited on the color filter patterns and on the regions of second protecting film uncovered with the color filter patterns. The photoresist film is to compensate the height difference of each of the color filter patterns and also to play a role of mask for etching the protecting films to form pads of metal wire. The photoresist is then selectively exposed at the pad open regions and developed to be removed at the pad open regions. After that, using the photoresist as a etching mask, the second and first protecting film are, in turn, selectively etched at the pad open regions to form the pads of metal wire. At this time, since the formation of pads is performed after the formation of color filter patterns, the surfaces of the pads are devoid of the other material such as the color filter material. The photoresist is preferably formed with transparent material in order to prevent the photosensitivity of the photodiode form being deteriorated.

Figure 2F:
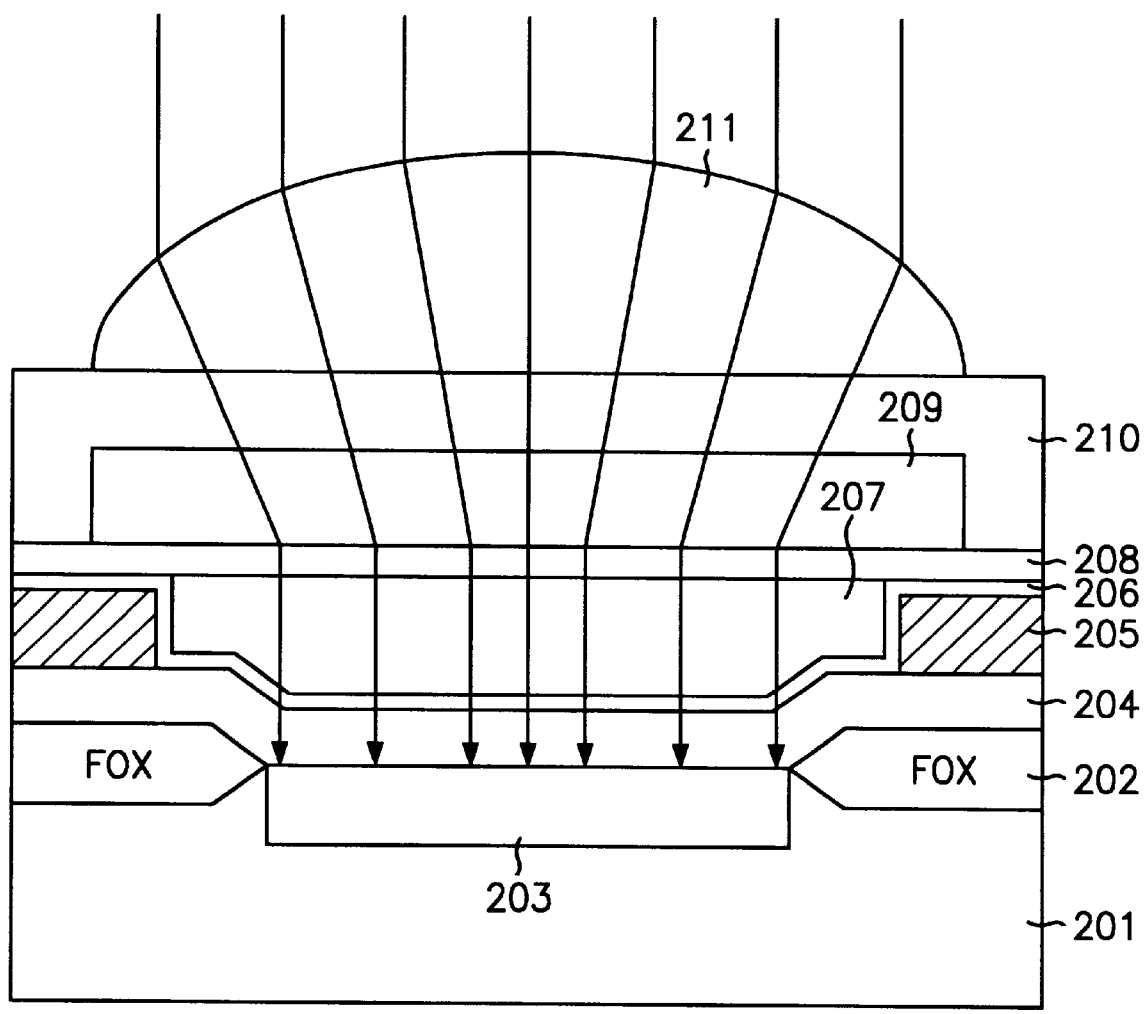

Next, as shown in FIG. 2f, microlenses 211 are formed on the flattened photoresist 210. At this time, all of the microlenses 211 corresponding to each of the unit pixels are uniform in the figures. This is caused from that the height difference of each of color filter patterns is improved by the photoresist. The distance between the microlens and the photodiode of unit pixel in the image sensor according to the present invention is also longer than that of the prior art. Thus, the distance in the image sensor of the present invention may be more fitted with the focal length of the microlens than that of the prior art. Further, the thickness of the photoresist can be adjusted exactly to focus the incident lights onto the photodiode. The thickness may be preferably adjusted based on the focal length of the microlens in the well-known medium of, particularly, vacuum or air and the indices of refraction of the films between the microlens and the photodiode. Accordingly, the photosensitivity of the image sensor in accordance with the present invention can be enhanced.

In the embodiment as described above, since the SOG film is excellent in the flatness property without the etch-back process, the oxynitride film 209 may be formed on the unetched SOG film. Instead of the photoresist, a photoresist for flattening of the color filter patterns and a photoresist for pad opening may be separately applied.

While the present invention has been described with respect to certain preferred embodiment only, other modifications and variations may be made without departing from the spirit and scope of the present invention as set forth in the following claims.

What is claimed is:

1. A CMOS image sensor comprising:
    a substrate including at least one photosensitive element for receiving an incident light;
    an interlayer-insulating film over the substrate;
    metal wire patterns on the interlayer-insulating film;
    a first protecting film covering the metal wire patterns and the portion of the interlayer-insulating film overlaying the photosensitive element;

a flattening layer over the first protecting film;

a second protecting film over the flattening layer and the portion of the first protecting film overlaying the metal wire patterns, having an adjustable refraction index for enhancing photosensitivity and thereby refracting and proceeding the incident light to the photosensitive element;

color filter patterns over the second protecting film;

a photoresist film covering the color filter patterns and the second protecting film and thereby flattening them, having an adjustable thickness for exactly focusing the incident light onto the photosensitive element; and at least one microlens over the photoresist film, wherein the thickness of the photoresist film is adjusted based on a focal length of a microlens.

2. The image sensor according to claim 1, wherein the flattening layer is a spin-on-glass film wholly etched to expose the portion of the first protective film overlaying the metal wire patterns.

3. The image sensor according to claim 1, further comprising a pad open region through the photoresist film, the first protecting film and the second protecting film.

4. The image sensor according to claim 1, wherein the first protecting film is an oxide film.

5. The image sensor according to claim 1, wherein the second protecting film is an oxynitride film.

6. The image sensor according to claim 1, wherein the thickness of the photoresist is determined to focus the incident light on to the photosensitive element.

7. The image sensor according to claim 6, wherein the thickness of the photoresist is determined based on the focal length of the microlens in the medium of vacuum or air and the indices of refraction of the films between the microlens and the photosensitive element.

8. The image sensor according to claim 1, wherein the photoresist is a transparent material.

* * * * *